(12) United States Patent
Kofford

(10) Patent No.: US 8,547,240 B2
(45) Date of Patent: Oct. 1, 2013

(54) TRANSMITTER WITH BATTERY STATUS INDICATOR

(75) Inventor: Bradley C. Kofford, Bountiful, UT (US)

(73) Assignee: Controlled Entry Distributors, Inc., Salt Lake City, UT (US)

( * ) Notice: Subject to any disclaimer, the term of this patent is extended or adjusted under 35 U.S.C. 154(b) by 351 days.

(21) Appl. No.: 12/205,533

(22) Filed: Sep. 5, 2008

(65) Prior Publication Data

US 2010/0060467 A1  Mar. 11, 2010

(51) Int. Cl.
  *G08B 21/00*  (2006.01)
  *G01R 5/26*  (2006.01)

(52) U.S. Cl.
  USPC ...................................... 340/636.15; 324/106

(58) Field of Classification Search
  USPC ............ 324/106; 340/825.69, 636.15, 539.1; 455/67.11; 320/134
  See application file for complete search history.

(56) References Cited

U.S. PATENT DOCUMENTS

| | | | |
|---|---|---|---|
| 4,808,995 A | | 2/1989 | Clark |
| 4,968,941 A | * | 11/1990 | Rogers ........................... 324/428 |
| 5,266,942 A | | 11/1993 | Stoller |
| 5,345,163 A | * | 9/1994 | Gibbons et al. ............... 320/163 |
| 5,680,112 A | * | 10/1997 | Xydis ....................... 340/636.15 |
| 5,798,681 A | | 8/1998 | Chang |
| 5,802,467 A | | 9/1998 | Salazar et al. |
| 5,825,174 A | * | 10/1998 | Parker ........................... 324/106 |
| 5,841,361 A | | 11/1998 | Hoffman |
| 6,114,830 A | | 9/2000 | Luo |
| 6,346,889 B1 | | 2/2002 | Moss |
| 6,362,771 B1 | * | 3/2002 | Schofield et al. ............. 341/176 |
| 6,661,340 B1 | | 12/2003 | Saylor |
| 7,020,442 B2 | * | 3/2006 | Najafi et al. ................ 455/67.11 |
| 7,047,087 B2 | | 5/2006 | Hantke |
| 7,071,813 B2 | | 7/2006 | Fitzgibbon |
| 7,106,168 B2 | | 9/2006 | McMahon |
| 7,123,144 B2 | | 10/2006 | Anderson |
| 7,397,359 B2 | * | 7/2008 | Sparacino ...................... 340/505 |
| 7,605,263 B2 | * | 10/2009 | Schmid et al. .................. 546/62 |
| 2004/0203433 A1 | * | 10/2004 | Najafi et al. ................ 455/67.11 |
| 2005/0190798 A1 | | 9/2005 | Chau et al. |
| 2006/0006876 A1 | * | 1/2006 | Bertness ........................ 324/426 |
| 2006/0158339 A1 | | 7/2006 | Brundula |
| 2006/0164208 A1 | | 7/2006 | Schaffzin |
| 2006/0220785 A1 | | 10/2006 | Ferdman |
| 2009/0102642 A1 | * | 4/2009 | Huseth et al. ............. 340/539.13 |
| 2010/0181964 A1 | * | 7/2010 | Huggins et al. ............... 320/108 |

* cited by examiner

*Primary Examiner* — Benjamin C Lee
*Assistant Examiner* — Sigmund Tang
(74) *Attorney, Agent, or Firm* — Holland & Hart

(57) ABSTRACT

A battery powered transmitter is provided with a battery status circuit that determines an output voltage level associated with the battery. The battery status circuit is provided with multiple voltage reference thresholds. One or more visual voltage status indicators are electrically coupled with the battery status circuit. The battery status circuit actuates a visual voltage status indicator when the battery status circuit determines the voltage output level of the battery to be within a first output range. One or more additional visual voltage status indicators may be actuated when the battery status circuit determines the voltage output level of the battery to be within other output ranges.

1 Claim, 4 Drawing Sheets

TRANSMITTER WITH BATTERY STATUS INDICATOR

BACKGROUND

Hand-held transmitters have become fairly ubiquitous. Many people operate such transmitters to open and close garage doors, activate and deactivate security systems for automobiles, automated gates, and control a wide array of basic systems such as irrigation systems, and the like. A typical hand-held transmitter is battery powered and includes a transmitter that may be associated with a controller circuit, which contains the data that is transmitted from the system. Other, more complex systems may include receivers and other circuits designed for different functions. However, all of these functions draw power from the battery, which is typically provided with a single, non-renewable charge.

When the battery within a transmitter loses its charge, the transmitter loses or has diminished functionality. In many instances, this may mean that an individual is locked out of a garage or an automobile. This may prove to be more than a simple inconvenience, such as when an alarm system or irrigation system operates solely on remote controlled access. Typically, an individual is left with a transmitter having insufficient voltage to operate and no back-up batteries readily available. Carrying around a supply of batteries is impractical. Accordingly, users are forced to simply wait for the battery within the transmitter to expire due to a lack of adequate forewarning. Only with such forewarning can users safely and conveniently replace transmitter batteries prior to their expiration.

Various prior art transmitting devices have been provided with an audible or visual indicator to advise their users that power within the devices had nearly expired. However, such systems would only have nough power to warn users of a low battery condition, but not enough power to operate the device. Sometimes users have found themselves in situations that have made it inconvenient, if not impossible, to stop what they were doing and find a location that sells the right replacement battery. In such instances, the users have invariably needed to continue use of the transmitters as the low battery signal was activated. This has left the users wondering how many transmissions were possible with the existing battery, hoping the power would not expire before the need for the transmitter was satisfied. None of the prior art systems have provided multi-staged voltage status indications that permitted casual continued use of the transmitters without fear of the transmitters dying at the wrong time.

Another issue related to low battery conditions in portable transmitters has centered on the power demand of various transmitters. In many instances, transmitting devices are provided as multi-tasking devices that include, transmitters, receivers, controller circuits, lit displays, and the like. As such, use of such transmitters has depleted the battery supply more rapidly than single use transmitters. A last-minute low-battery warning to a user may be far too late to do any good. The power consumption needs of some transmitting devices would fully deplete a low voltage supply shortly after the low-battery warning could be issued.

SUMMARY

This Summary is provided to introduce a selection of concepts in a simplified form that are further described below in the Detailed Description. This Summary, and the foregoing Background, is not intended to limit the claimed subject matter.

A system for transmitting a signal is generally provided with a battery, a transmitter and a battery status circuit. The transmitter and battery status circuit may be electrically coupled with the battery according to various different embodiments. In one aspect, the battery status circuit is provided to determine a voltage output level associated with the battery. A voltage reference circuit may be associated with the battery status circuit. In at least one embodiment, the voltage reference circuit is provided with a plurality of different voltage thresholds. One or more visual voltage status indicators may be electrically associated with the battery status circuit. In at least one embodiment, the battery status circuit may be provided to actuate one or more visual voltage status indicators when the battery status circuit determines the voltage output level of the battery to be at or near one or more predetermined levels.

In one aspect, one or more LEDs are provided to serve as the one or more visual voltage status indicators. In one embodiment, the one or more LEDs emit different colored lights, with each color corresponding to a different voltage output level. Exemplary voltage output levels may include approximations of a 50% charged battery and a 25% charged battery.

In another embodiment, the system functions at least in part as a transmitter for operating a garage door or automated gate. As such, a controller circuit may be electrically coupled with the transmitter and provided with data that is coded to actuate one or more garage door openers. However, it is contemplated that the system offers sufficient flexibility to be used in conjunction with a nearly endless list of wireless transmitter operations and is not limited to the operation of garage door openers.

These and other aspects of the present system and method will be apparent after consideration of the Detailed Description and Figures herein.

DRAWINGS

Non-limiting and non-exhaustive embodiments of the present invention, including the preferred embodiment, are described with reference to the following figures, wherein like reference numerals refer to like parts throughout the various views unless otherwise specified.

DETAILED DESCRIPTION

Embodiments are described more fully below with reference to the accompanying figures, which form a part hereof and show, by way of illustration, specific exemplary embodiments. These embodiments are disclosed in sufficient detail to enable those skilled in the art to practice the invention. However, embodiments may be implemented in many different forms and should not be construed as being limited to the embodiments set forth herein. The following detailed description is, therefore, not to be taken in a limiting sense.

Figure 1:
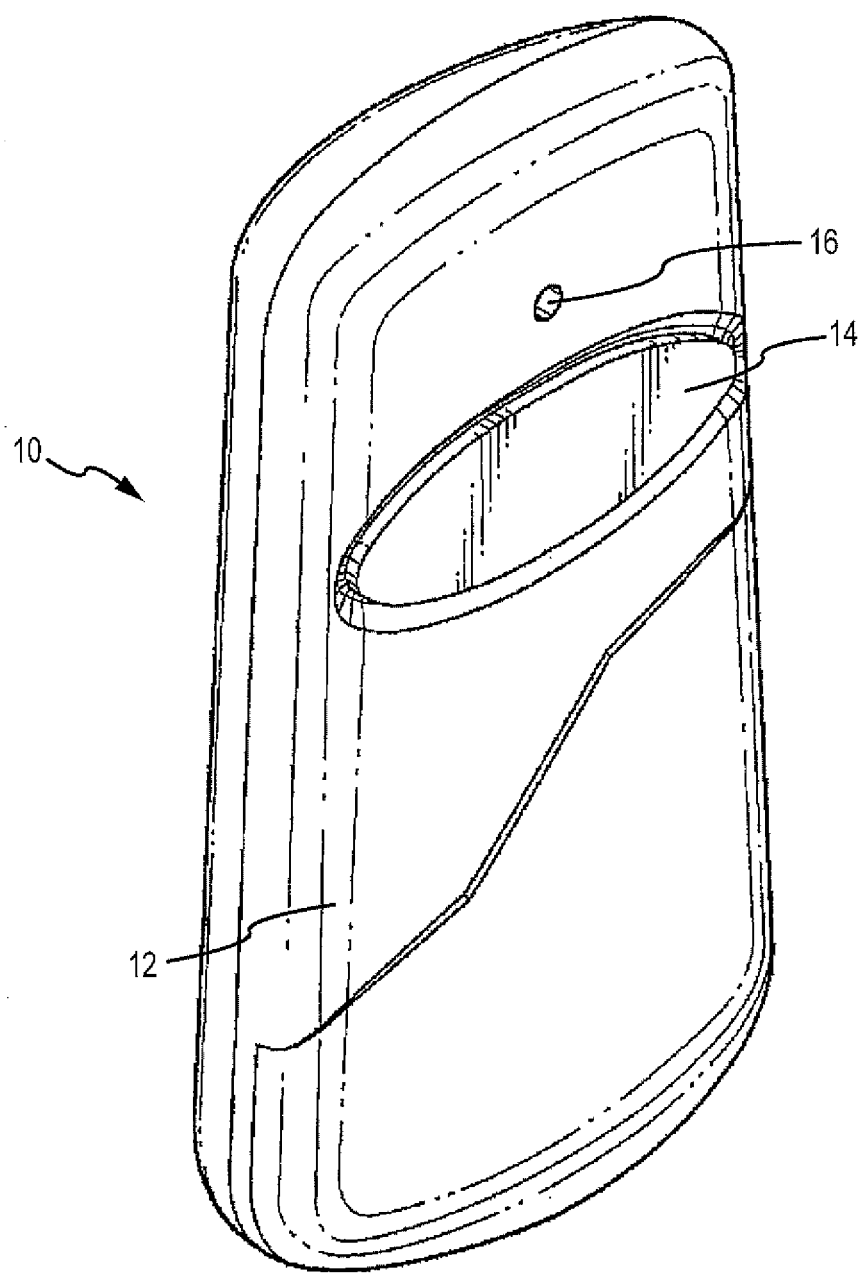
FIG. 1 depicts a front perspective view of one embodiment of a transmitter with a battery status indicator according to the present technology.
Figure 2:
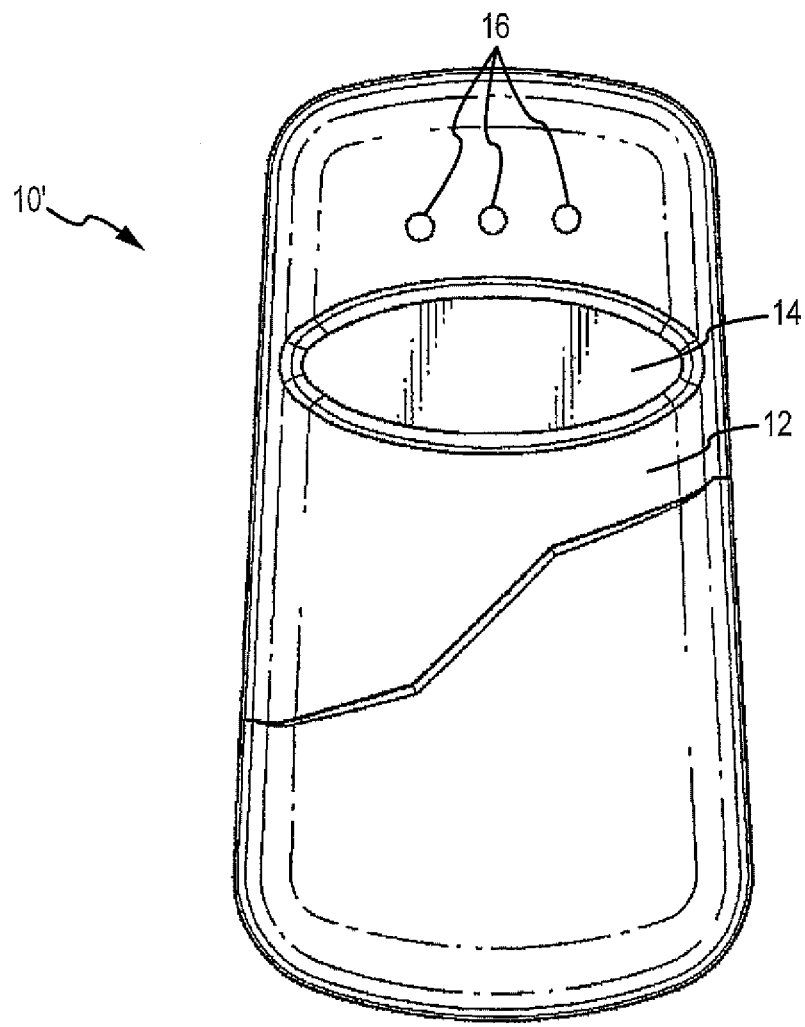
FIG. 2 depicts a front elevation view of another embodiment of a transmitter with a battery status indicator according to the present technology.

Referring to FIG. 1, there is illustrated a handheld transmitter 10 that may be used for a wide array of wireless transmission purposes, such as activating an automated garage door opener. A housing 12 (i.e., a compact, handheld housing) is formed using one of various conventional known methods, such as various molding processes that use plastic and other formable materials. An activation button 14 is disposed within an opening formed in the housing 12 so that a user may conveniently engage the activation button 14 for when using the transmitter 10. One or more visual voltage status indicators 16 may be associated with the housing 12 in a position that provides a user with an unobstructed view of the visual voltage status indicators 16 when the transmitter 10 is in use. With reference to FIG. 2, a transmitter 10 is depicted as being provided with three visual voltage status indicators 16. As will be discussed at further length below, one or more visual voltage status indicators 16 may be associated with the transmitter 10 according to the intended functionality of the transmitter 10. In some embodiments, the visual voltage indicators may be provided as one or more light-emitting diodes (LEDs). Single color LEDs may be used where a plurality of visual voltage indicators 16 are provided. In such an embodiment, the individual visual voltage indicators may be associated with a particular color that denotes a particular output voltage. However, in other embodiments, one or more multi-color LEDs may be used. For example, a single multicolor LED may be provided to emit a different color of light for each of a plurality of different output voltages. More specifically, a tri-color LED may be utilized.

The output voltage of a battery will gradually drop from an initial fully-charged value, V0, as the battery's charge is depleted with normal operation of the device to which it is attached. The output voltage gradually drops until it reaches a first threshold voltage, V1. The operating region between V0 and V1 may be commonly described as an optimal operating region of the device to which the battery is attached. In a transmitting device, such as a garage door opener, a user will typically not perceive any loss in effectiveness of the transmitting device even though the battery output voltage may have dropped significantly from its initial value. Oftentimes, the transmitting device will operate in the optimal operating region for a relatively long time. Even after the battery output voltage has dropped below V1, a battery operated transmitting device such as a garage door opener may continue to function normally for some time, as long as the battery output voltage does not drop below a second threshold voltage, V2. While the transmitting device may operate in the suboptimal voltage region between V1 and V2, the operational effectiveness of the transmitting device will begin to degrade over time. However, when the transmitting device begins to operate in this suboptimal region, the user should be warned that the battery will need to be replaced in the near future. Below the second threshold voltage V2, the performance of the transmitting device will continue to degrade until the device becomes inoperable.

It is contemplated that the values of V1 and V2 are dependent on the circuit configuration and application requirements of each battery operated device used. Determining these values, however, is easily determined using conventional experimental methods. In transmitting devices such as garage door operators, the values of V1 and V2 depend on the type and quality of equipment used to receive signals e.g., a receiver's ability to receive different signal strength) the from the transmitting device and open the garage door. Other environmental conditions that interfere with the transmitting and receiving signals may further bear on the values of V1 and V2. Accordingly, the threshold voltage values are preferably determined using an experimental process based, at least in part, on the type of transmitting and receiving equipment to be used, the surrounding environmental conditions, and the intended use of the equipment. For example, in some embodiments, the values for V1 and V2 may be set at 50% and 25%, respectively, of the nominal value of V0 for a typical battery. However, these exemplary values may be inadequate for use with other implementations. Accordingly, the values may be modified according to the facts presented. Moreover, some applications may make it desirable to include additional threshold voltage values, creating additional voltage ranges that may be identified and/or monitored.

Figure 3:
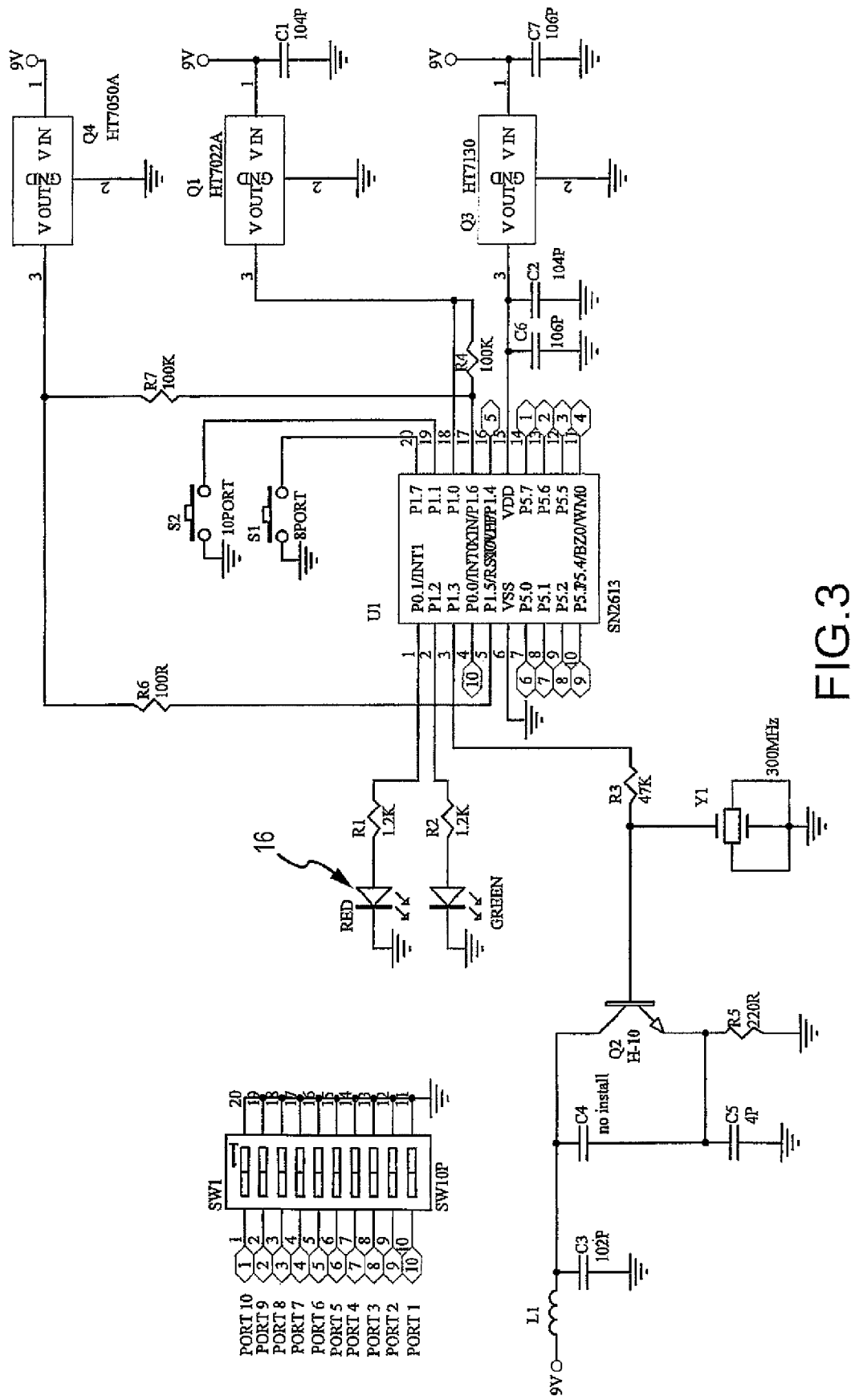
FIG. 3 depicts a schematic diagram of an example of a transmitter with a battery status indicator according to the present technology.

With reference to FIG. 3, an exemplary circuit diagram is depicted as including a controller circuit, which may be of a type commercially available for operating garage door openers. However, FIG. 3 further depicts an exemplary battery status indicator circuit that is operatively integrated with the controller circuit to form microcontroller U1. The elements of these circuits are identified herein by the reference numerals indicated in FIG. 3. Certain elements described herein have dual designations for the purpose of Table I which follows.

TABLE I

| Reference No. | Description |
| --- | --- |
| C1 | Capacitor 104P |
| C2 | Capacitor 104P |
| C3 | Capacitor 102P |
| C4 | Capacitor |
| C5 | Capacitor 4P |
| C6 | Capacitor 106P |
| C7 | Capacitor 106P |
| L1 | Inductor |
| Q1 | Transistor HT7022A |
| Q2 | Transistor H-10 |
| Q3 | Transistor HT7130 |
| Q4 | Transistor HT7050A |
| R1 | Resistor 1.2K |
| R2 | Resistor 1.2K |
| R3 | Resistor 47K |
| R4 | Resistor 100K |
| R5 | Resistor 220R |
| R6 | Resistor 100K |
| R7 | Resistor 100K |
| S1 | Switch 8 Port |
| S2 | Switch 10 Port |
| U1 | Microcontoller Circuit SN2613 |
| Y1 | Clock Circuit 300 MHz |

In the exemplary circuit depicted in FIG. 3, power (such as nine volt DC power) is supplied to the microcontroller circuit U1 by a battery that is electrically coupled with the transmitter 10. Power is directed through transistor Q4 to the microcontroller U1 and may provide a reference to the microcontroller U1 as to the actual voltage supply coming from the battery. Transistor Q1 is also electrically coupled with the battery and microcontroller U1. Capacitor C1 is associated with transistor Q1 and provided to serve as a voltage reference for the microcontroller U1, such as V1. Similarly, transistor Q3 is electrically coupled with the battery and microcontroller U1. Capacitor C7 is associated with transistor Q3 and provided to serve as another voltage reference for the microcontroller U1, such as V2.

The microcontroller circuit U1, is situated within the circuit and provided with logic to: (a) operate a transmitting function of the transmitter 10, including the storage of data (such as garage door opener codes) relative to the transmitting function; (b) receive voltage input from transistors Q4, Q1 and Q3; (c) compare a voltage supply reading from transistor Q4 with voltage input received from transistors Q1 and Q3;

and (d) actuate one or more visual voltage indicators 16 according to the comparison of voltage supply to voltage input received from transistors Q1 and Q3. Accordingly, in some embodiments, specific logic associated with microcontroller U1 measures the voltage of the battery associated with the transmitter 10 and enables one or more visual voltage indicators 16 if battery voltage falls below one or more predetermined voltage levels.

Figure 4:
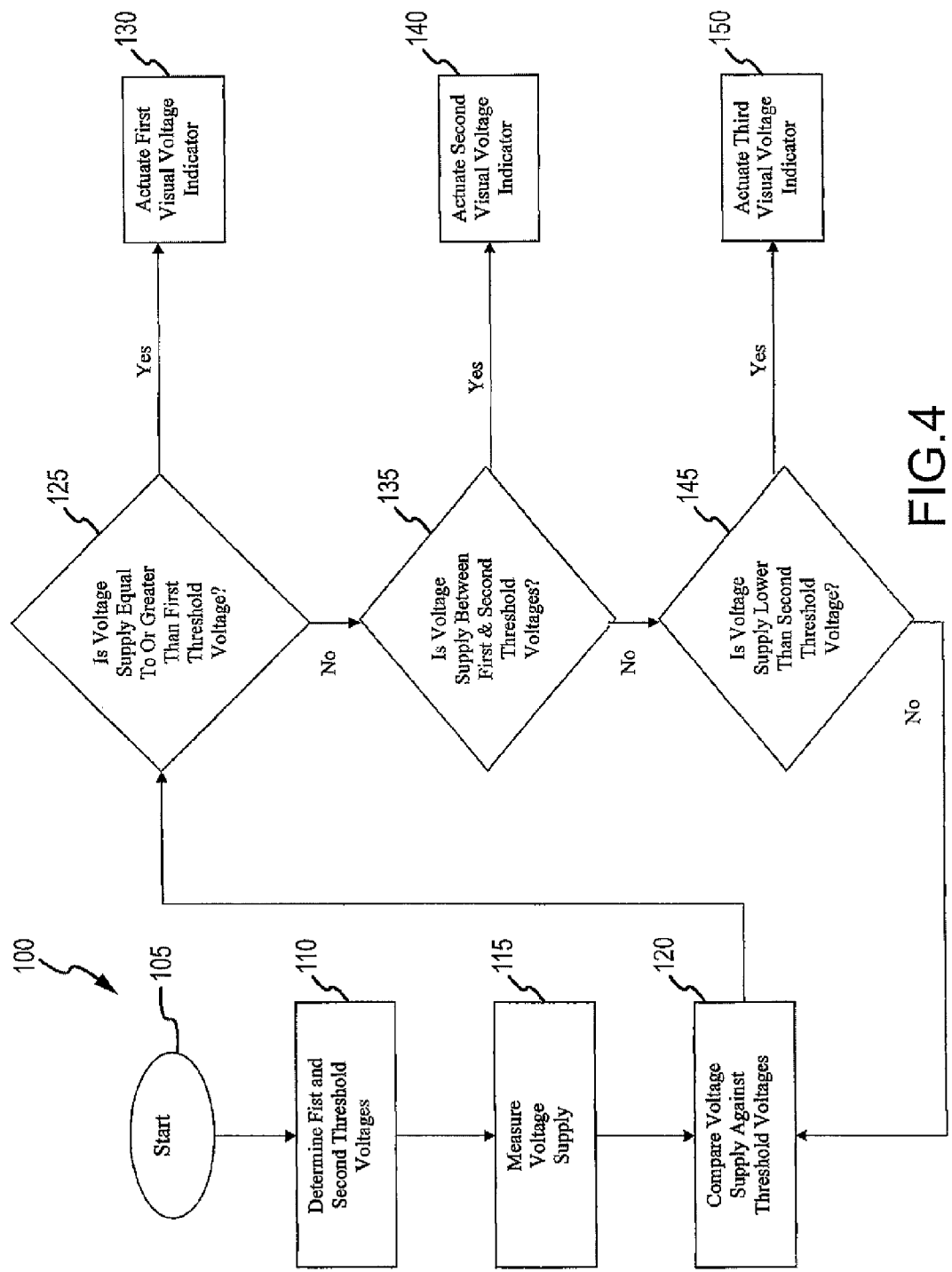
FIG. 4 depicts a flow diagram illustrating a method for battery status detection according to the present technology.

Operation of the transmitter 10 is believed to be readily understandable from the foregoing description and consideration of FIG. 3. However, FIG. 4 presents a flow diagram that illustrates an exemplary embodiment of a method 100 for determining and indicating battery status according to aspects of the present technology. The method begins at step 105 and at 110 at least two threshold voltages V1 and V2 mentioned above are determined. It is contemplated that step 10 may be performed experimentally during the design process for a particular transmitting device so that the voltage thresholds are fixed at predetermined values throughout operation of the transmitting device. It is contemplated, however, that the threshold voltages may be variable to enable a user to adapt operation of the transmitting device and the manner in which its battery voltage supply is monitored.

At step 115, the battery output voltage is measured. The output voltage in some embodiments is measured at specified sampling intervals that are determined according to the requirements of each implementation. In one embodiment, where the transmitting device is used to operate garage door openers, the output voltage may be measured at each activation of the transmitter 10. At step 120, the measured battery output voltage is compared with the threshold voltages V1 and V2. While some embodiments perform this step within microcontroller U1, the measuring and comparing steps may be performed using a plurality of conventional comparator and reference circuits known to those skilled in the art.

If the measured battery output voltage at step 120 is determined to be equal to or greater than threshold voltage V1, microcontroller U1 will actuate the first visual voltage indicator. In some embodiments, the first visual voltage indicator will be provided by a green light that is visible to the user. Where the output voltage is determined at step 120 to be between threshold voltages V1 and V2, microcontroller will actuate the second visual voltage indicator. In some embodiments, the second visual voltage indicator is provided by a yellow light that is visible to the user. However, if the measured battery output voltage at step 120 is determined to be less than threshold voltage V2, microcontroller U1 will actuate the third visual voltage indicator. Various embodiments may use a red light, visible to the user, as the third visual voltage indicator. It is contemplated that one or more lights, such as LEDs may be used to emit the aforementioned lights in various different colors according to nearly any desired notification pattern.

In some embodiments, an unqualified measurement of the battery output voltage will cause the process to loop to step 115. Some embodiments may continue this loop at regular intervals even though one or more visual voltage indicators have been actuated by the microcontroller U1 following step 120. Still other embodiments may simply initiate the method 200 on activation of the transmitter 10 and terminate the method 200 after the actuation of a visual voltage indicator. In this manner, power within the transmitter 10 may be conserved and an indication of the battery status provided to the user only on activation of the transmitter 10.

Construction and operation of the transmitter 10 is believed to be understandable to those skilled in the art based on the foregoing description read in conjunction with the drawings. Conventional materials may be used to fabricate the housing 12 for the transmitter 10 and components described herein which are not otherwise described with respect to the type of material to be used for fabrication thereof.

Although the system has been described in language that is specific to certain structures, materials, and methodological steps, it is to be understood that the invention defined in the appended claims is not necessarily limited to the specific structures, materials, and/or steps described. Rather, the specific aspects and steps are described as forms of implementing the claimed invention. Since many embodiments of the invention can be practiced without departing from the spirit and scope of the invention, the invention resides in the claims hereinafter appended. Unless otherwise indicated, all numbers or expressions, such as those expressing dimensions, physical characteristics, etc. used in the specification (other than the claims) are understood as modified in all instances by the term "approximately." At the very least, and not as an attempt to limit the application of the doctrine of equivalents to the claims, each numerical parameter recited in the specification or claims which is modified by the term "approximately" should at least be construed in light of the number of recited significant digits and by applying ordinary rounding techniques. Moreover, all ranges disclosed herein are to be understood to encompass and provide support for claims that recite any and all subranges or any and all individual values subsumed therein. For example, a stated range of 1 to 10 should be considered to include and provide support for claims that recite any and all subranges or individual values that are between and/or inclusive of the minimum value of 1 and the maximum value of 10; that is, all subranges beginning with a minimum value of 1 or more and ending with a maximum value of 10 or less (e.g., 5.5 to 10, 2.34 to 3.56, and so forth) or any values from 1 to 10 (e.g., 3, 5.8, 9.9994, and so forth).

The invention claimed is:

1. A system for transmitting a signal, the system comprising:
   a battery;
   a transmitter, electrically coupled with the battery;
   a battery status circuit comprising a voltage reference circuit and a comparator circuit, the battery status circuit being electrically coupled with the battery to determine a voltage level associated with the battery each instance the transmitter transmits data, wherein the voltage level indicates a current strength of a signal emitting from the transmitter, wherein the voltage level is determined by measuring a reduction in the voltage level across at least one circuitry element electrically coupled to the battery status circuit, wherein the battery status circuit receives a first voltage input from a first transistor, the first voltage input representing an actual voltage supply level of the battery, wherein the battery status circuit receives a second voltage input from a second transistor, the second voltage input representing a first voltage threshold, and wherein the battery status circuit receives a third voltage input from a third transistor, the third voltage input representing a second voltage threshold, and wherein the battery, the transmitter, and the battery status circuit are enclosed in a housing;
   the first voltage threshold being determined by determining a receiver's ability to receive signals at a first signal strength from the transmitter, environmental conditions, and an intended use of the transmitter, the first threshold approximating the voltage output of a charged battery at a first level;

the second voltage threshold being determined by determining the receiver's ability to receive signals at a second signal strength from the transmitter, environmental conditions, and an intended use of the transmitter, the second threshold approximating the voltage output of the charged batter at a second level, the second level being less than the first level;

a first visual voltage status indicator electrically coupled with the battery status circuit;

a second visual voltage status indicator electrically coupled with the battery status circuit; and a third visual voltage status indicator electrically coupled with the battery status circuit, the first visual voltage status indicator, the second visual voltage status indicator, and the third visual voltage status indicator being provided as one or more light emitting diodes (LEDs), the one or more LEDs providing a first color of light for the first voltage status indicator, a second color of light for the second visual status indicator, and a third color of light for the third visual voltage status indicator, the first, second, and third colors of light being different from one another, the first, second, and third colors of light representing a particular output voltage;

the battery status circuit being provided to actuate the first visual voltage status indicator when the battery status circuit determines the actual voltage supply level of the battery to be above the first voltage threshold, the first visual voltage status indicator emitting a light of the first color according to a first predetermined pattern;

the battery status circuit further being provided to actuate the second visual voltage status indicator when the battery status circuit determines the actual voltage supply of the battery to be between the first voltage threshold and the second voltage threshold, the second visual voltage status indicator emitting a light of the second color according to a second predetermined pattern;

the battery status circuit further being provided to actuate the third visual voltage status indicator when the battery status circuit determines the actual voltage supply of the battery to be lower than the second voltage threshold, the third visual voltage status indicator emitting a light of the third color according to a third predetermined pattern;

a controller circuit, electrically coupled with the transmitter, the controller circuit being provided with data that is transmittable by the transmitter and coded to actuate a garage door opener;

the battery status circuit further being provided to measure output voltage of the battery at each activation of the transmitter, wherein the transmitter is activated by a user depressing a button coupled to the transmitter.

* * * * *